United States Patent [19]

Fisher

[11] 4,345,168
[45] Aug. 17, 1982

[54] ELECTRICAL PEAK DETECTOR

[76] Inventor: Alan J. Fisher, 5711 Tannahill Cir., Huntsville, Ala. 35802

[21] Appl. No.: 136,839

[22] Filed: Apr. 3, 1980

Related U.S. Application Data

[62] Division of Ser. No. 13,907, Feb. 22, 1979, Pat. No. 4,254,441.

[51] Int. Cl.³ .......................................... H03K 5/153
[52] U.S. Cl. .................................... 307/351; 328/151
[58] Field of Search ................. 307/350, 351; 328/151

[56] References Cited

U.S. PATENT DOCUMENTS 3,287,570  11/1966  Wilson ............................... 307/351
3,766,411  10/1973  Arnold ............................... 307/351

Primary Examiner—John Zazworsky
Attorney, Agent, or Firm—C. A. Phillips

[57] ABSTRACT

An electrical peak detector wherein two complementary transistors have commonly connected base leads and emitter leads, and a capacitor is connected between the collector of each transistor to a constant potential point. An input circuit is connected between the commonly connected base terminals and emitter terminals through a capacitor.

3 Claims, 3 Drawing Figures

ELECTRICAL PEAK DETECTOR

This is a division of application Ser. No. 13,907 filed Feb. 22, 1979, now U.S. Pat. No. 4,254,441.

In accordance with this invention, a peak detector is constructed employing a pair of complementary type transistors, and wherein the emitter elements are connected together to one terminal, and base elements are connected together at another terminal. A capacitor is connected between the collector of each transistor to a constant potential point. A signal input circuit is connected between the common bases and common emitters through a capacitor.

DETAILED DESCRIPTION OF THE DRAWINGS

Figure 1:
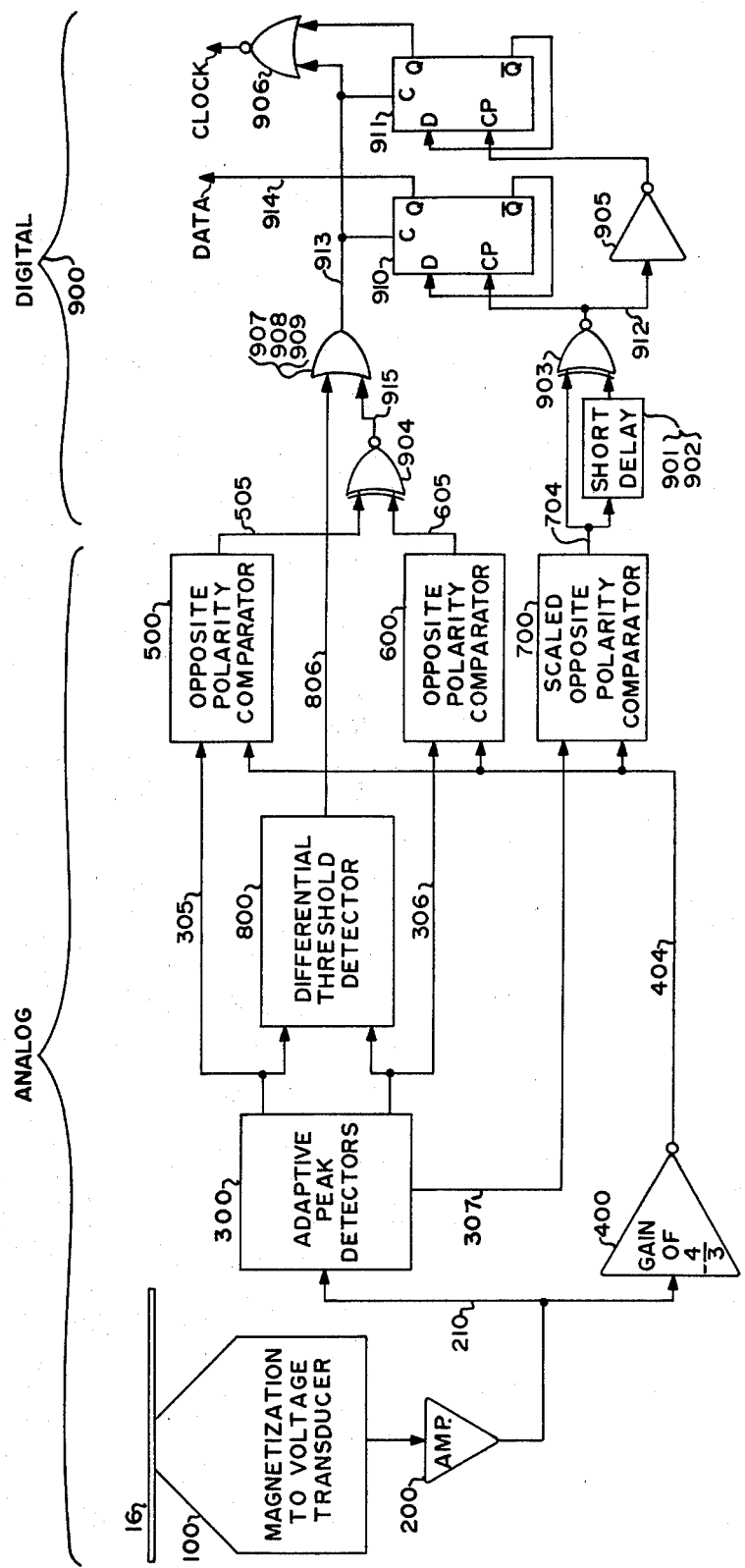
FIG. 1 is a functional block diagram of an embodiment of the system of this invention.

FIG. 1 shows a typical functional block diagram of a binary code reading system wherein the peak detector of this invention is employed. Each analog function or means for performing that function has been assigned a separate one hundred series number for identification. Other figures will then identify particular parts or signals within that function by using numbers within that one hundred series of numbers.

Figure 3:
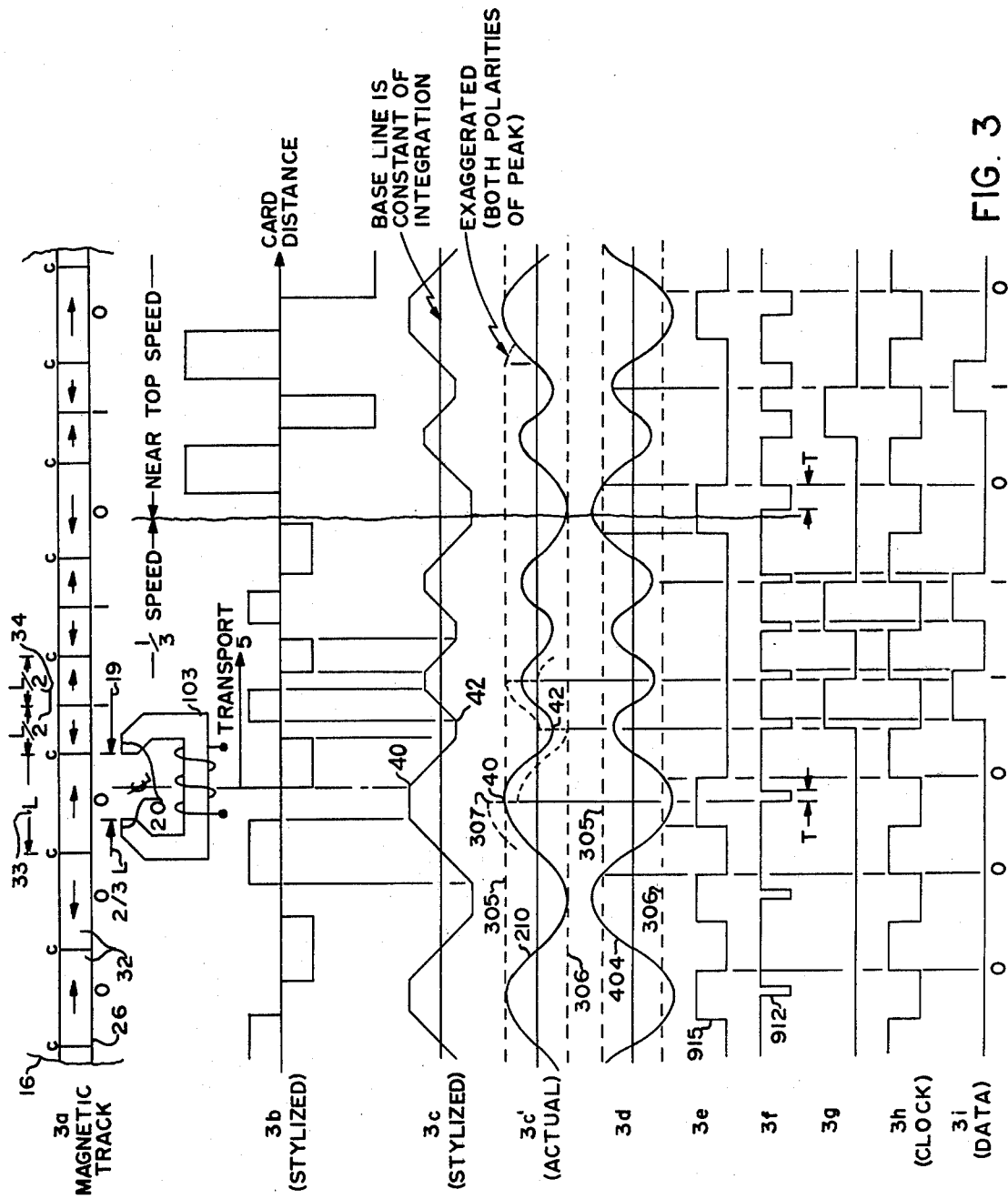
FIG. 3a is the card's recorded magnetic track.
FIGS. 3b–3i are waveforms illustrating aspects of the operation of the systems shown in FIGS. 1 and 2.

In FIG. 1, item 16 is the magnetically encoded card moving in a guide past transducer 100. Function 100 is a wide aperture direct magnetization-to-voltage transducer, as stipulated, which translates the two card-recorded wavelengths into a voltage waveform having two possible peak amplitudes, as shown in FIG. 3c'. Function 200 simply amplifies this signal to a convenient level for processing by functions 300 and 400. Function 300 contains two adaptive peak detectors which provide two output voltages 305 and 306 (FIG. 3c'), one equal to the positive peak, and one equal to the negative peak of the larger of the two possible amplitudes of signal 210. Function 400 simply amplifies signal 210 by four-thirds and inverts it. Its output 404 (FIG. 3d) is applied to all three opposite polarity comparators 500, 600, and 700. Comparator 500 compares this signal with the positive peak detector output to produce the digital signal 505, "M > +¾", i.e., magnetization is greater than three-fourths of the positive peak. Comparator 600 compares signal 404 with the negative peak detector output to produce the digital signal 605, "M < ¾". EXCLUSIVE NOR gate 904 receives both of these signals to produce signal 915 (FIG. 3e) which, by virtue of this gate's exclusive function, produces a positive pulse for each encoded "0". This output of 904 is applied to dual input OR gate units 907, 908, and 909, along with a muting signal 806 from 800. Digital muting signal 806 is at its low level during a reading operation, and so signals 915 and 913 are then identical and are applied to the C (clear) terminals of both flip-flops 910 and 911 to inhibit (override) their changing state during a recorded "0".

Function 700 compares the inverted signal 404 with a compound signal 307 (FIG. 3c') from the peak detectors. This compound signal contains waveform 210 plus (transistor turn-on) transitions at each zero slope point of waveform 210. Thus, when comparator 700 subtracts an inverted version of waveform 210, namely 404 from compound signal 307, the result 704 is a digital signal which changes state at each zero slope point of waveform 210. This 704 signal is applied directly and also via the delay of 901 and 902 to the inputs of FXCLUSIVE NOR gate 903. This produces signal 912 (FIG. 3f), consisting of short low level pulses beginning at each zero slope point of waveform 210. These 912 pulses are applied to the clock pulse (CP) inputs of the flip-flops, directly to the data producing flip-flop 910 and via inverter 905 to the (sometimes) clock producing flip-flop 911. The system's clock output signal (FIG. 3h) is finally derived by combining the "0" output of 911 with "clear" signal 913 in NOR gate 906. The system's data output (FIG. 3i) is the "0" output of flip-flop 910.

FIG. 3a schematically illustrates an enlarged portion of a recorded magnetic track 26 on a credit card 16 wherein the direction of magnetization of discrete areas of the track are illustrated by arrows 32. The magnetized wide regions 33 are representative of data "0's", and a pair of the narrow width magnetized regions 34 are representative of data "1's". Arrow 5 is indicative of the direction of movement of head 103 relative to card 16, and it will be noted that the head has a spacing or gap 19 equal to two-thirds the width of a wide spaced magnetization region 33. Wide region 33 is also equal to bit lengths L and the spacing of clock transitions C. The narrow width magnetization regions 34 are one-half the width of the wide space magnetization regions. The face or nose 20 of the head's pole piece is actually placed against the card's track 26, but as shown here, it is projected 90 degrees into the plane of the figure to show its scale and position relative to the track.

FIGS. 3b and 3c are idealized or stylized waveforms shown for purposes of illustration, and actual waveforms would not have changes in value or slope as abrupt as shown.

FIG. 3b illustrates the output of head 103 at each engagement position along track 26. The waveform is falling at the position shown for the centerline of the head's gap because the right-hand (leading) edge of the gap is now encountering a recorded reversal of magnetization while the rest of the gap contains no change in magnetization. Just prior to this position, zero change of magnetization was within the gap; and just past this position, a positive-going transition will be within the gap to produce the head output waveform shown.

Note that the amplitude of the waveform of FIG. 3b is three times greater toward the right-hand end of the track where transport speed is represented as three times faster than the first of the track. This is a result of the rate-of-change type head here shown, 103. This speed increase has not changed the widths of the pulses here plotted because the variable (abscissa) is card distance rather than time. This amplitude-proportional-to-speed signal of FIG. 3b becomes the signal of FIG. 3c after time base integration, now a signal of two possible amplitudes independent of speed.

Waveform 3c is illustrative of the direct output, without integration, of a direct magnetization-to-voltage type transducer, e.g., a Hall effect type transducer. This waveform clearly indicates the translation of recorded length-to-signal amplitude as two possible encoded length regions 33 and 34 are translated to two possible signal peak amplitudes 40 and 42. The particular head gap of two-thirds L results in a 2:1 ratio of these amplitudes. Since the effect can be achieved without the step of integration in the one case, it is clear that the length-to-amplitude translated waveform of this invention is clearly caused by this relatively large reading aperture, the gap width, rather than by virtue of integration of the signal from a rate-of-change head.

FIG. 3c' illustrates a realistic version of the stylized waveform shown in FIG. 3c where the abrupt slope changes are lost because of finite aspects of the recording and head. The first detection step is that of amplitude discrimination, and it is achieved by setting three-fourths maximum amplitude thresholds by peak detecting both polarities of waveform 210 to provide threshold signals 305 and 306, and then amplifying waveform 210 by minus four-thirds to provide waveform 404 as shown in FIG. 3d. Opposite polarity comparison is explained here with respect to FIG. 1 and is the comparison of waveform 404 with both waveforms 305 and 306 as illustrated in FIG. 3d, and whereby derived signal 915 is obtained as shown in FIG. 3e comprising pulses each time waveform 404 of FIG. 3d exceeds either threshold 305 or 306. These pulses contain the zero bit data.

The required additional information, that of the location of data "1's", can be (and has been) obtained from the baseline crossing of signal 210 (FIG. 3c'); but because of the uncertainties of locating the baseline accurately, it has been found that it is better to detect the points of zero slope of signal 210 as described by functions 700, 901, 902, and 903 to produce signal 912 (FIG. 3f). This waveform contains the needed information missing between data "0's" of waveform 3d. It is used to toggle both flip-flops, waveforms 3g and 3i, whenever they are not being held clear by the data "0" signal 915 (or mute signal 806).

FIG. 3h illustrates the system clock output pulses which are obtained as described above. (These pulses might more accurately be called strobe pulses as they are not time based.

Figure 2:
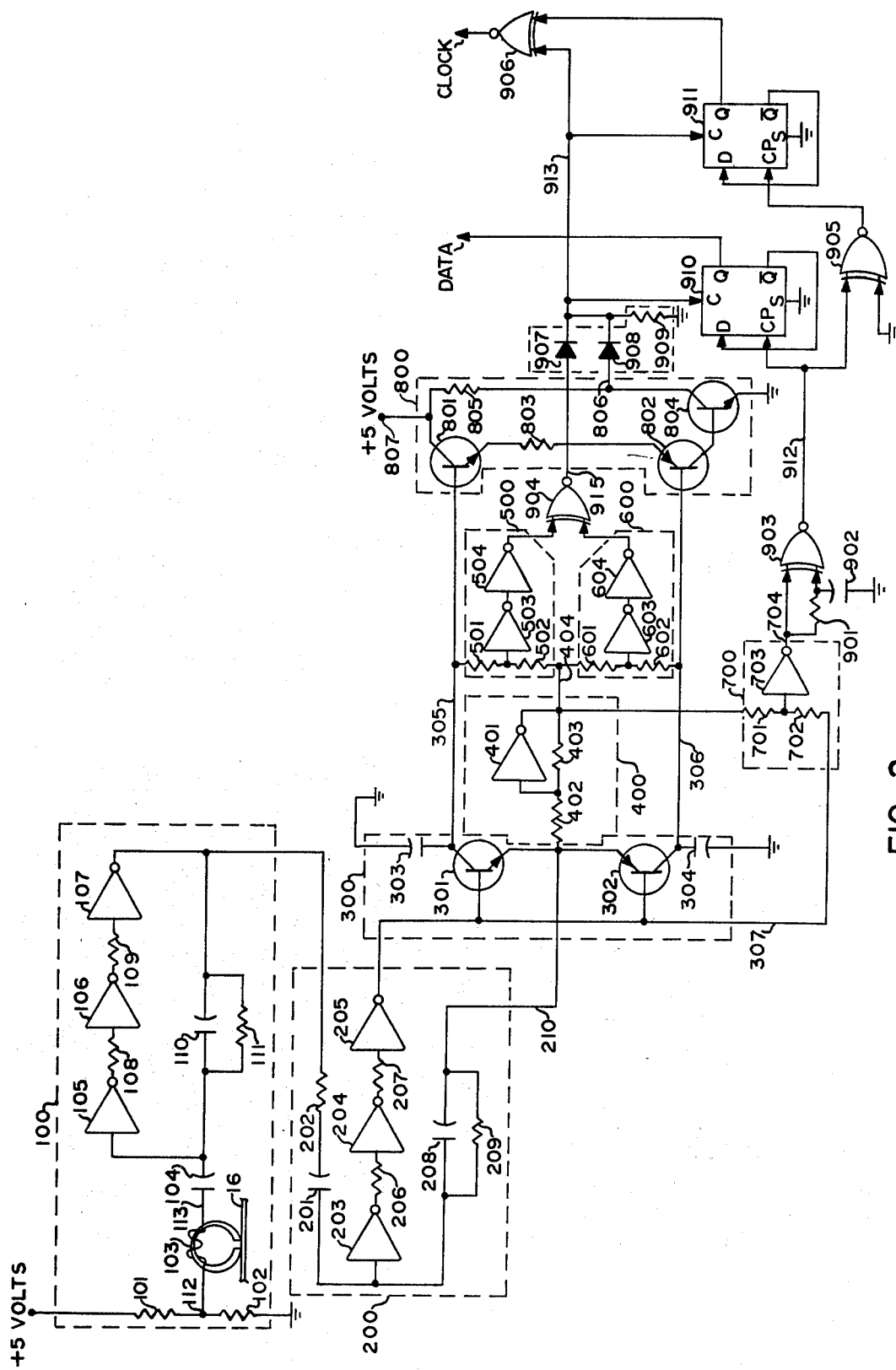
FIG. 2 is an electrical diagram of an embodiment of this invention.

Reference is now made to FIG. 2, which illustrates in greater detail the system shown in FIG. 1. Resistors 101 and 102, connected between a 5-volt source and ground and being of equal value, provide a voltage of half the supply voltage to terminal 112 of rate-of-change-of-magnetization read head 103. Capacitor 104 connects the head voltage to the input of cascaded inverting amplifiers 105, 106, and 107, interconnected by resistors 108 and 109. CMOS inverters are used for both amplifiers and comparators in this embodiment because of their low cost and large output voltage swing capabilities. This unorthodox use of CMOS inverters is best appreciated if each is considered to be a differential amplifier with only the inverting input terminal available. The non-inverting input terminal may be considered internally returned to a reference potential of approximately one-half the supply voltage. This is the internal crossover potential of the two complementary transistors within each inverter. This crossover potential is essentially the same for all six inverters on the common chip of a standard CMOS hex-inverter. This matching of inverters on a common chip will be used to an advantage, as will be further explained.

Considering inverters 105, 106, and 107 as a single amplification unit, capacitor 110 and parallel connected resistor 111 provide a feedback control for this unit. Resistors 108 and 109, in conjunction with the input capacitance of each inverter, provide compensation within the cascaded amplifier unit to prevent closed loop oscillation of MHz frequencies. At operating frequencies, the parallel source resistance of resistor 101 and 102 and feedback capacity 110 cause the overall amplification to time-base integrate the output of the head signal (as degraded by virtue of the effective aperture discussed).

The output of inverting amplifier 107 is connected through oscillation inhibiting resistor 202 and capacitor 201 to a second amplification unit consisting of cascaded amplifiers 203, 204, and 205. Resistors 206 and 207 interconnect inverting amplifiers 203, 204, and 205, and similarly prevent MHz oscillations within these cascaded inverting amplifiers. The output of amplifier 205 is connected to both bases of the emitter-connected complementary transistors 301 and 302, with the emitters then being connected back to the input of amplifier 203 through parallel-connected capacitor 208 and resistor 209, which provide a controlled feedback for amplification. In this regard, the ratio of input capacitor 201 and feedback capacitor 208 is chosen to provide a voltage gain of 10 at all operating frequencies. The voltage waveform 113 at the output of head 103 is shown in FIG. 3b. The waveform at the base of transistors 301 and 302 is shown as waveform 307, and the voltage waveform at the emitter of these transistors is shown as waveform 210, both in FIG. 3c'. Responsive to waveform 210, as shown in FIG. 3c', transistor 301 is controlled to charge capacitor 301 to the positive peak value via its base-collector diode. Similarly, waveform 210 is applied to transistor 302, causing capacitor 304 to charge to the corresponding peak amplitude value in a negative direction. Just before each subsequent peak in the waveform, each capacitor is slightly discharged by the normal functioning of these transistors since their emitter currents are in quadrature (90 degree leading) with the emitter voltages. This quadrature relationship between emitter current and voltage is established by capacitor 208 being the predominant load to each transistor. The degree of discharge of capacitors 303 and 304, occurring 45 degrees before recharge, is as shown in FIG. 3c', set at approximately one percent by the ratio of capacitor 203 to one of these capacitors, or in the range of ratios of 0.001 to 0.1. Thus, both levels or waveforms 305 and 306 are adjusted for each new peak of signal 210, provided the new peak value is within one percent of a preceding peak. This adaptive action has been found most desirable to adjust for baseline drifts which may occur during a card reading. It is to be noted that this peak self adjustment is on a per cycle basis in the length domain (per cycle) and independent of time since it is determined by a capacitance ratio.

The base-collector and base-emitter forward drops of transistors 301 and 302 have essentially identical temperature tracking characteristics.

Waveform 210 is also applied to inverter 401 via resistor 402. The feedback resistor 403 relative to resistor 402 sets the output voltage of this overall amplifier 400 at four-thirds larger than its input signal 210 and is inverted. This inversion and gain sets the amplitude discrimination levels at three-fourths of the peaks when this signal is applied to the opposite polarity comparators 500 and 600 along with one of the polarities of detected peak voltage from one of capacitors 303 or 304.

The two opposite polarity comparators 500 and 600 are otherwise identical. Comparator 500 consists of equal input resistors 501 and 502 which average the two opposite polarity input signals and compares the result with the internal crossover voltage of the complementary CMOS transistors within 503. The extra gain of cascaded inverter 504 simply increases the slope of the transitions in the comparison signal from 503 to provide an essentially digital output to gate 904. Comparator 600 operates likewise.

Thus, one or the other signals, from comparator 500 or 600, is making a transition each time the signal 404 passes through either polarity of the discrimination threshold of three-fourths the peak of signal 404. These digital signals applied to EXCLUSIVE NOR gate 904 result in the output waveform 915 shown in FIG. 3e. This waveform indicates all of the data "0" bits, but provides no indication of the number of data "1" bits intervening.

One form of generating the "1" bits is by generating pulses at each waveform crossing of a baseline and then suitably combining the digital waveforms. However, the (otherwise desirable) deggradation of the read head produces enough shift in the local baseline so that certain data combinations cause errors in precisely determining baseline crossings. Accordingly, as one feature of the present invention, the applicant has determined a better method, and this is to produce a narrow pulse beginning at each zero slope point of the waveform rather than at each baseline crossing as these waveform points are relatively less effected by local baseline drift.

At this point, it is to be noted that waveform 307 (FIG. 3c') at the bases of transistors 301 and 302 is a summation of two waveforms: the emitter waveform 210 plus a rectangular waveform having transitions each time conduction shifts from one of these complementary transistors to the other. As the predominant load for these transistors is capacitor 208, these transitions occur at each zero slope point of waveform 210 where capacitor 208 stops being charged in one direction and begins in the other direction. Thus, when suitably scaled resistors 702 and 701, connected between the output of amplifier 400 and the bases of transistors 301 and 302, average this complex waveform with signal 404, there is a cancellation of all the waveforms except the transitions of signal 307. This residual binary waveform is then fed through comparing amplifier 703 directly to one input of EXCLUSIVE NOR gate 903 and also through a time delay circuit consisting of a series input resistor 901 and grounded input capacitor 902 to the second input of EXCLUSIVE NOR gate 903. This delay circuit thus determines the narrow pulse width of the output of EXCLUSIVE NOR gate 903 as shown in FIG. 3f as waveform 912. The time constant (T) of this delay circuit must be chosen short enough so that these pulses do not extend into the other decoding transitions at the highest card transport speed.

The pulses from EXCLUSIVE NOR gate 903 are applied directly to the clock pulse (CP) input of flip-flop 910 and through inverting gate 905 to the CP input of flip-flop 911. Both of these flip-flops are connected to toggle responsive to each rise of their respective CP signals by virtue of each Q output connected to the D input. These flip-flops are allowed to toggle only with an encoded "1" by applying signal 915 from EXCLUSIVE NOR gate 904 through diode 907 to the clear (C) input of the flip-flops as an overriding inhibiting signal. As will be further explained, diode 908 is combined in circuit with diode 907 and resistor 909 to form an OR circuit to also cause inhibition when the circuit is not energized by a signal from a card being read.

The Q output of flip-flop 911 is as shown in FIG. 3g as a positive pulse beginning at each zero slope point of a lower amplitude, "1's" represented sinusoid of waveform 210 shown in FIG. 3c and ending at the next zero slope point.

The data waveform from the Q output of flip-flop 910, shown in FIG. 3i, is identical with the waveform shown in waveform 3g except delayed by the width of a zero slope pulse (delay 901 and 902), as shown in FIG. 3f as "T", because it is clocked by the positive-going transition of the zero slope pulse, while the "1" derived output of flip-flop 911 is clocked negative-going transition of the zero slope pulse because of the inversion through gate 905. The clock output signal is the NOR combination of the "Q" output of 911 and signal 915, shown in FIG. 3e, as fed through diode 907, the two signals being combined in EXCLUSIVE NOR circuit 906, and thus the clock output indicated in FIG. 3h is shown as an output of the circuit. EXCLUSIVE NOR circuits are used for both the NOR function 906 and the inverter function of 905 because they are standard CMOS chip leftovers from EXCLUSIVE NOR circuits 903 and 904.

As suggested above, OR diode 908 provides an inhibiting action when a card is not being transported past read head 103. This prevents circuit noise or stray pickup from producing outputs from the unit. As further elements employed to effect this function, complementary transistors 801 and 802 are used, their bases being connected to ± peak voltage capacitors 303 and 304, respectively, and their emitters being connected together through resistor 803. When the ± peak voltage difference exceeds two emitter-base voltage drops, the collector-emitter circuit of these transistors conduct a current from +5 volts source 807 to the base of transistor 804. Gains are such that peak-to-peak noise is insufficient to turn on 801 and 802 and hence 804, but encoded cards, even with low magnetization, will. Therefore, with a read signal, transistor 804 is turned on, and its collector voltage is pulled down so that diode 908 is turned off, and thus there occurs no inhibition of flip-flops 910 and 911 except as controlled by output 915 of EXCLUSIVE NOR circuit 904. However, without a read signal, transistor 804 is off and resistor 909, connected to the output of both diodes 907 and 908, along with resistor 805 of +5 volts at 807, turns diode 908 on to hold the "clear" inputs of both flip-flops active. This clears both flip-flops so that the Q outputs are forced to a "0" state which mutes or inhibits both outputs, data and clock, when no read signal is present.

It is to be noted that the crossover potential of the CMOS transistors internal to inverter 203 determines the quiescent baseline of waveform 210, and this internal potential is analogous to the return of a non-inverting differential amplifier terminal. Thus, in order for inverting amplifier 401 to operate as an inverter without appreciable baseline shift, and for inverters 503, 603, and 703 to operate as accurate comparators from this common baseline, these four CMOS units must share a common chip. This matching of crossover voltages eliminates the need to actually connect a common reference voltage between functions 200, 400, 500, 600, and 700. The total of 12 inverting amplifiers as used in FIG. 2 requires two standard CMOS hex inverters.

The peak-to-peak voltage of signal 210 is about two volts during operation, and hence signal 404 is 2⅔ volts. These large signal swings are obtained with only a 5 volt supply by virture of the complementary drive within inverting amplifiers 205 and 401. These peak values are quite large compared to those of noise and differences of crossover voltages within a given inverter chip. All the circuits shown in FIG. 2 are powered at 5 volts and draw only about 6.3 Ma of current. These circuits decode the standard American Banking Association track of credit cards (which use the Aiken self-clocking code) at any card acceleration between 1.5 and 40 inches per second. When a read head is used which is magnetically shielded, the assemblies are markably unaffected by electromagnetic interference. Also, the analog amplifiers are designed to provide a good rejection to supply voltage ripple and come to operating bias quickly after power is applied.

Having thus described my invention, what is claimed is:

1. A peak detector comprising:

signal means for providing an alternating potential between first and second terminals;

first and second bi-polar complementary transistors connected emitter-to-emitter, and thereby providing a common emitter terminal, and connected base-to-base, and thereby providing a common base terminal;

circuit means connecting said first terminal to said common base terminal;

a first capacitor connected in circuit between the collector of said first transistor and any constant potential, and a second capacitor connected in circuit between the collector of said second transistor and any constant potential point; and feedback means connected between said common emitter terminal and said common base terminal, including capacitance means for coupling a capacitive effect between said common emitter terminal and said common base terminal;

whereby, upon the application of a said alternating potential and thereby the operation of said transistors, said first and second capacitors are alternately charged to the respective peaks of a common emitter voltage through base-collector diodes of each transistor, and then each capacitor is partially discharged before the next peak of its charging potential by virtue of transistor action of quadrature phased emitter currents.

2. A peak detector as set forth in claim 1 wherein the ratio of the capacitance of said capacitance means to the capacity of each said collector capacitor determines the percentage of each discharge just before recharge, and where said ratio is between 0.001 and 0.1.

3. A peak detector as set forth in claim 2 wherein the base-collector and base-emitter forward bias drops have substantially identical temperature tracking characteristics.

* * * * *